United States Patent
Tanaka et al.

(10) Patent No.: US 12,278,198 B2
(45) Date of Patent: Apr. 15, 2025

(54) SEMICONDUCTOR DEVICE ON WIRING BOARD HAVING REFERENCE POTENTIAL PLANES WITH OPENINGS

(71) Applicant: RENESAS ELECTRONICS CORPORATION, Tokyo (JP)

(72) Inventors: Yoshikazu Tanaka, Tokyo (JP); Tadashi Kameyama, Tokyo (JP); Takafumi Betsui, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 426 days.

(21) Appl. No.: 17/743,033

(22) Filed: May 12, 2022

(65) Prior Publication Data

US 2023/0369257 A1 Nov. 16, 2023

(51) Int. Cl.
*H01L 23/66* (2006.01)
*H01P 3/08* (2006.01)

(52) U.S. Cl.
CPC .............. *H01L 23/66* (2013.01); *H01P 3/081* (2013.01); *H01L 2223/6627* (2013.01); *H01L 2223/6638* (2013.01)

(58) Field of Classification Search
CPC ....................... H05K 1/0245; H01L 2223/6638
See application file for complete search history.

(56) References Cited

U.S. PATENT DOCUMENTS

| 7,202,758 | B2* | 4/2007 | Hsu | H01P 3/085 |
| | | | | 333/33 |
| 2011/0279189 | A1* | 11/2011 | Umeda | H05K 1/0245 |
| | | | | 333/5 |
| 2015/0342030 | A1* | 11/2015 | Watanabe | H05K 1/0225 |
| | | | | 174/268 |
| 2017/0271282 | A1* | 9/2017 | Lin | H01L 23/49822 |

OTHER PUBLICATIONS

H. Watanabe et al., "An Investigation of FPC's High Frequency Characteristics", Fujikura Technical Daily, Fujikura Co., Ltd., Apr. 2006, No. 110, p. 19-22, with English abstract.

* cited by examiner

*Primary Examiner* — Eric A. Ward
(74) *Attorney, Agent, or Firm* — Rimon P.C.

(57) ABSTRACT

A semiconductor device includes a semiconductor package having a differential signal terminal pair, and a wiring board. The wiring board includes a first and a second signal transmission line and a reference potential plane. The first and the second signal transmission line is formed in a first conductive layer and connected to the differential signal terminal pair. The reference potential plane includes a conductive pattern formed in a different conductive layer from the first conductive layer. The conductive pattern includes a first and a second region overlapped with the first and the second signal transmission line in plan view, respectively. The conductive pattern has a plurality of openings in the first and the second region. An area of a first conductive portion of the reference potential plane in the first region becomes equal to an area of a second conductive portion of the reference potential plane in the second region.

7 Claims, 10 Drawing Sheets

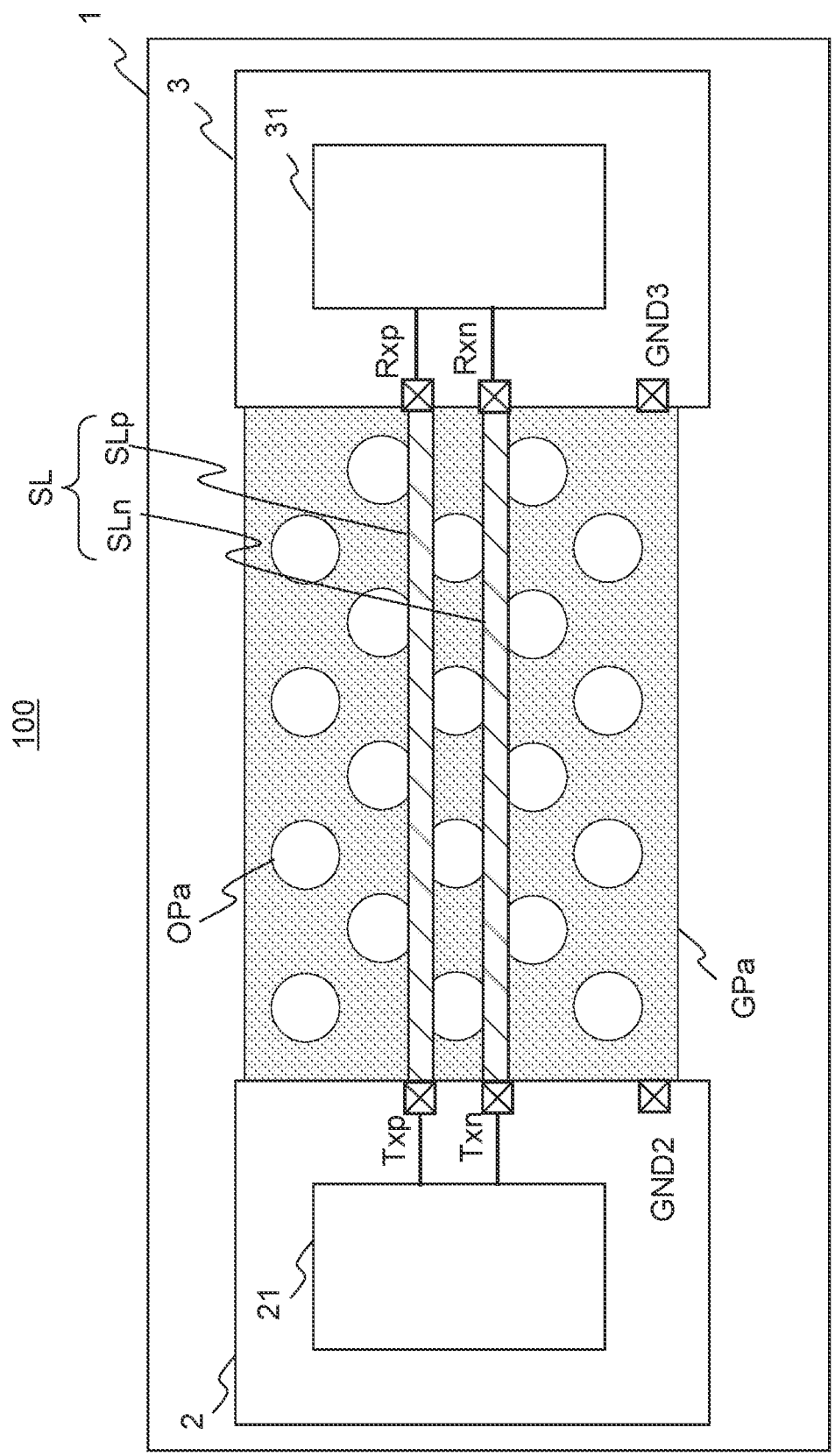

SEMICONDUCTOR DEVICE ON WIRING BOARD HAVING REFERENCE POTENTIAL PLANES WITH OPENINGS

BACKGROUND

The present invention relates to a semiconductor device, for example, can be suitably used in a semiconductor device comprising a semiconductor element for transmitting a signal at high speed and a wiring board for mounting the same.

THE BACKGROUND OF THE INVENTION

In order to transmit data at high speed, various transmission standards have been upgraded to higher speeds. For example, standards such as PCI-e (Peripheral Component Interconnect-Express), DDR (Double Data Rate), USB (Universal Serial Bus), CSI (Camera Serial Interface), DSI (Display Serial Interface) have been upgraded to higher speeds. The high-speed transmission in accordance with such transmission standards is used in various devices such as automobiles, mobile devices, medical devices, and manufacturing equipment.

Generally, it is important for electronic devices including semiconductor devices for transmitting high-speed signals to take impedance matching so as not to deteriorate the signal quality of the input and output from the outside. For example, the characteristic impedance of a signal transmission line on a printed wiring board is an important factor with respect to impedance matching. Depending on the transmission standard, the characteristic impedance is predetermined. The characteristic impedance of the signal transmission line on the printed wiring board is determined by the wiring width of the signal transmission line, the material of the interlayer insulator (dielectric constant), the thickness of the layer of the printed wiring board (the thickness of the dielectric layer). Therefore, the wiring width of the signal transmission line is designed based on the material of the interlayer insulator and the thickness of the layer of the printed wiring board so that the characteristic impedance required by the transmission standard is realized.

Recently, the thickness of the interlayer insulator of the printed wiring board tends to be reduced along with multi-layering of the printed wiring board. Then, in order to realize the characteristic impedance required by the transmission standard, it is necessary to take measures such as reducing the width of the signal transmission line. However, thinning of the signal transmission line is susceptible to manufacturing errors of the wiring pattern, so that the error of the characteristic impedance is likely to occur.

There are disclosed techniques listed below.
[Non-Patent Document 1] "An Investigation of FPC's High Frequency Characteristics", Fujikura Technical Daily, Fujikura Co., Ltd., April 2006, No. 110, p. 19-22

For example, Non-Patent Document 1 discloses a technique for performing characteristic impedance control without reducing the wiring pattern of the signal transmission line. In Non-Patent Document 1, the characteristic impedance is adjusted by reducing the capacitance component of the signal transmission line by the mesh-shaped ground layer.

SUMMARY

The transmission of high-speed signals, the differential signal transmission system is often used. Balancing is important for the differential signal transmission line pair on the printed wiring board for transmitting the differential signal. For example, balancing is also required for the return current paths (return path) of the signal transmitting through the signal transmission lines. In the case of the differential signal transmission line, even if a meshed-shaped structure of square-block type is simply applied to ground plane where the return path is formed, the balance of characteristic impedances of the differential signal transmission lines is not maintained and it was found that there is a possibility that the signal quality is not improved.

Other objects and novel features will become apparent from the description of this specification and the accompanying drawings.

A semiconductor device according to one embodiment includes a semiconductor package having a differential signal terminal pair, and a wiring board on which the semiconductor package is mounted. The wiring board includes a first and a second signal transmission line formed in a first conductive layer and electrically connected to the differential signal terminal pair, and a reference potential plane having a conductive pattern which is formed in a second conductive layer adjacent to the first conductive layer and which includes a first region overlapped with the first signal transmission line in plan view and a second region overlapped with the second signal transmission line in plan view. The conductive pattern has a plurality of openings in the first and the second region. The first and the second signal transmission line is arranged such that an area of a first conductive portion of the reference potential plane in the first region becomes equal to an area of a second conductive portion of the reference potential plane in the second region.

According to the one embodiment, it is possible to improve the signal quality of the differential signal by adjusting the characteristic impedance while maintaining the balance of the differential signal transmission lines.

BRIEF DESCRIPTION OF THE DRAWINGS

FIG. 5 is an explanatory diagram showing a configuration example in a first modified example of the first embodiment.

DETAILED DESCRIPTION

Figure 1:
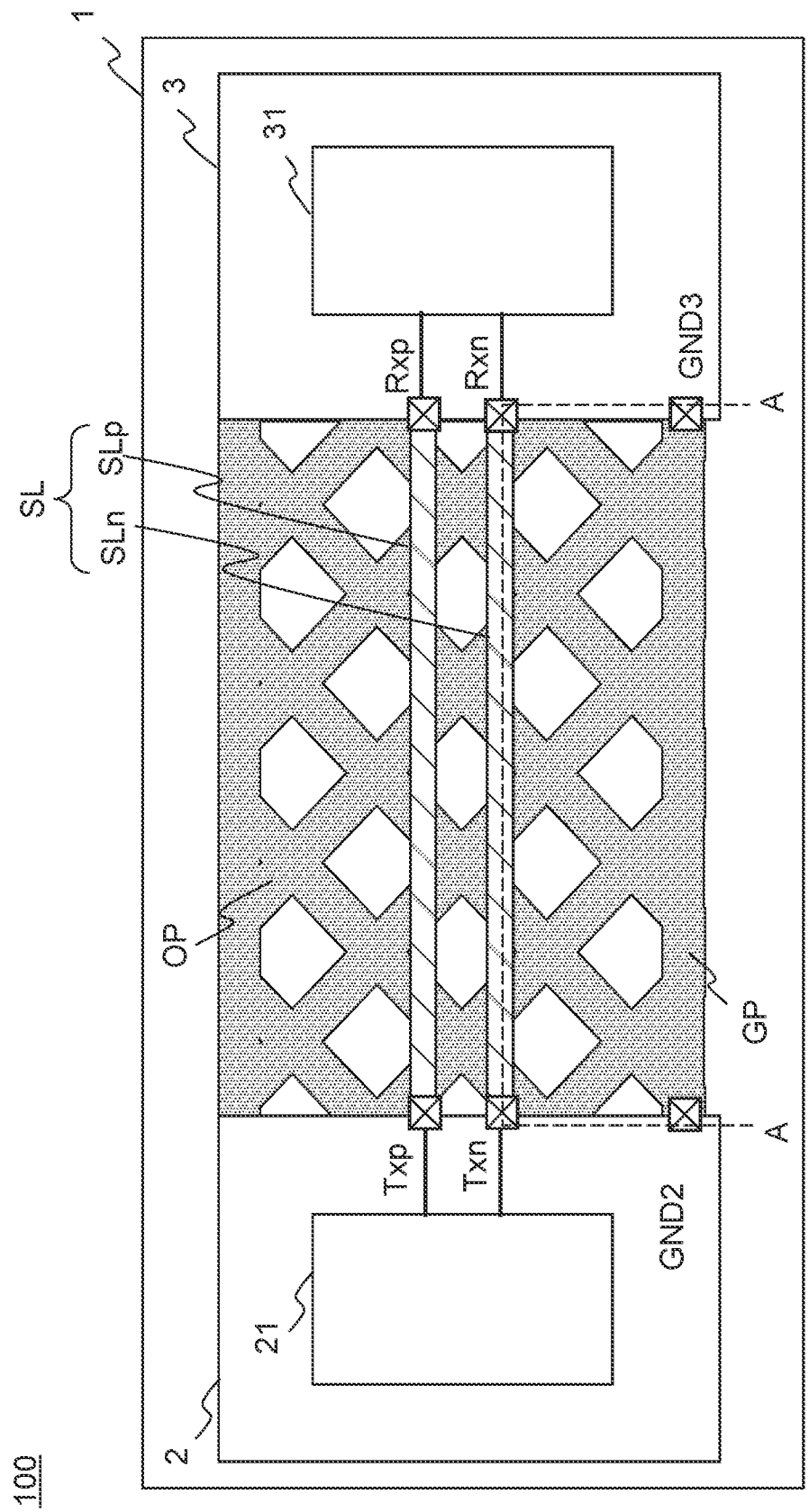
FIG. 1 is an explanatory diagram showing a configuration example of a semiconductor device of the first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

Figure 2:
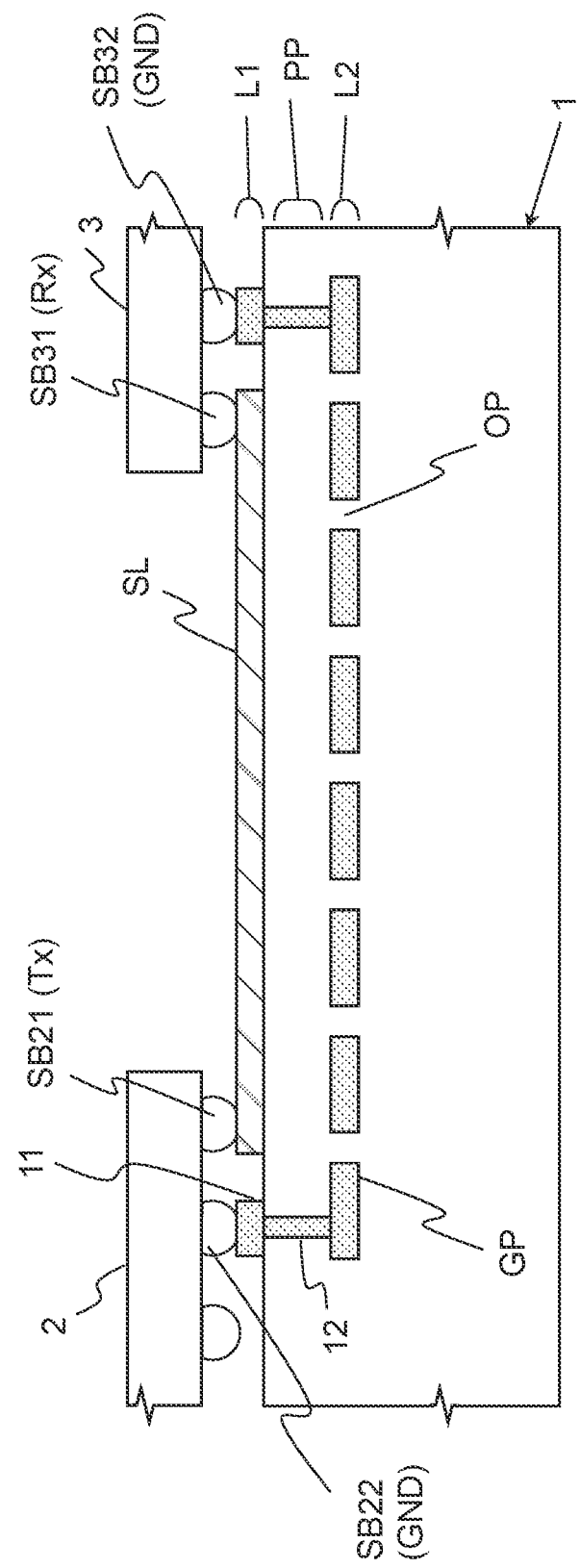
FIG. 2 is a cross-sectional view taken along line A-A of FIG. 1.

A configuration example of a semiconductor device for transmitting a high-speed signal will be described with reference to FIGS. 1 and 2. FIG. 1 is an explanatory diagram showing a configuration example of a semiconductor device of the present embodiment. FIG. 2 is a cross-sectional view taken along line A-A of FIG. 1.

The semiconductor device 100 shown in FIG. 1 has a wiring board 1 and semiconductor packages 2, 3 to be mounted on the wiring board 1. Herein, the wiring board may be referred to a printed circuit board, a motherboard or a mounting board. The semiconductor package 2 and the semiconductor package 3 are electrically connected to each other via signal transmission line SL formed on the wiring board 1. The semiconductor device 100 as shown in FIG. 1 includes a plurality of signal transmission lines SL. The differential signal transmission line SL transmits a high-speed differential signal. In the example shown in FIG. 1, the differential signal transmission line SL includes a pair of differential signal transmission lines SLp, SLn through which the differential signal is transmitted. Hereinafter, when referring to differential signal transmission lines SLp and SLn without distinguishing between them, they are simply referred to as a differential signal transmission line SL or a signal transmission line SL.

In the example shown in FIG. 1, the semiconductor package 2 has a semiconductor chip 21, differential signal transmission terminals Txp and Txn, and a ground terminal GND2. The differential signal transmission terminals Txp and Txn constitutes a differential signal transmission terminal pair. The differential signal transmission terminals Txp and Txn are connected to the differential signal transmission line SLp and SLn, respectively to transmit the transmission signal (differential output signal) from the semiconductor chip 21 to the differential signal transmission lines SLp and SLn. Incidentally, when referring to the transmission terminals Txp and Txn without distinguishing between them, they are simply referred to as the transmission terminal Tx.

The semiconductor package 3 has a semiconductor chip 31, differential signal receiving terminals Rxp, Rxn and a ground terminal GND3. The differential signal receiving terminal Rxp, Rxn constitutes a differential signal receiving terminal pair. The differential signal receiving terminals Rxp, Rxn are connected to the signal transmission line SLp, SLn, respectively to receive the signal transmitted from the semiconductor chip 21 to the semiconductor chip 31. When referring to the receiving terminals Rxp and Rxn without distinguishing between them, they are simply referred to as the receiving terminal Rx. The differential signal transmission line SL transmits, for example, signals according to PCI-express standard. For example, the differential signal transmission line SL transmits a signal having a transmission rate of about 64 GT/s (PCI-express Gen 6) from 2.5 GT/s (PCI-express Gen1).

The wiring board 1 is a multilayer wiring board obtained by laminating conductive layers and insulating layers having prepreg. As shown in FIG. 2, the wiring board 1 has conductive layers L1 and L2 and a prepreg layer PP. The prepreg layer PP is made of a glass fiber impregnated with a resin. The prepreg layer PP is formed between the conductive layers L1 and L2 to bond the conductive layers L1 and L2. The differential signal transmission line SL is formed in the conductive layer L1 which is a surface layer of the wiring board 1. That is, the differential signal transmission line SL has a microstrip line structure. A reference potential plane GP is used as a reference of the signal transmitting through the differential signal transmission line SL. The reference potential plane GP is a conductive pattern formed in the conductive layer L2 adjacent to the conductive layer L1 across the prepreg layer PP. The wiring board 1 shown in FIG. 2 includes the conductive layer L1 in which the differential signal transmission line SL is provided, the prepreg layer PP, and the conductive layer L2 in which reference potential plane GP is provided, but is not limited thereto. The wiring board 1 may further include a plurality of conductive layers and the prepreg layer.

As shown in FIG. 2, the transmission terminal Tx of the semiconductor package 2 is formed on the lower surface of the semiconductor package 2, for example, is electrically connected to the differential signal transmission line SL via a solder ball SB21. Similarly, the receiving terminal Rx of the semiconductor package 3 is formed on the lower surface of the semiconductor package 3, for example, is electrically connected to the differential signal transmission line SL via a solder ball SB31. The ground terminal GND2 formed on the lower surface of the semiconductor package 2 is electrically connected to the terminal electrode 11 on the wiring board 1 via the solder ball SB21. The terminal electrode 11 on the wiring board 1 is electrically connected to the reference potential plane GP through the via 12. The ground potential GND3 formed on the lower surface of the semiconductor package 3 is also electrically connected to the reference potential plane GP.

Returning to FIG. 1, the reference potential plane GP will be described. The reference potential plane GP is supplied with ground potential from the outside. Hereafter, the reference potential plane GP is referred to as a ground plane GP to which the ground potential is supplied. The ground plane GP has a region (first region) overlapping with the differential signal transmission line SLp in plan view and a region (second region) overlapping with the differential signal transmission line SLn in plan view. The ground plane GP serves as a reference for signals transmitting through the differential signal transmission lines SLp, SLn, respectively. In the ground plane GP, the return paths of the differential signal transmission line SLp, SLn are formed. In the first embodiment, the ground plane GP has square-shaped openings OP. That is, the ground plane GP has a mesh shape. The openings OP of the ground plane GP are provided in at least a region overlapping with the differential signal transmission lines SLp, LSn in plan view. The ground plane GP may be a solid conductive pattern except in the region overlapping with the differential signal transmission lines SLp, SLn in plan view.

The characteristic impedance Z0 of the signal transmission line on the wiring board can be expressed by $Z0=\sqrt{(L/C)}$, when the capacitance component per unit length C and the inductance component and L. As described above, when the printed wiring board is multilayered and the interlayer insulating layer (prepreg layer) becomes thin, the capacitance component C of the signal transmission line is increased, thereby reducing the characteristic impedance. In the present embodiment, the openings OP are formed in the ground plane GP. As a result, the capacitance component between the signal transmission line SL and the ground plane GP can be reduced. By changing the size of the square-shaped opening OP, i.e., the pattern width of the mesh, the pattern interval, it is possible to adjust the characteristic impedance.

Figure 3:
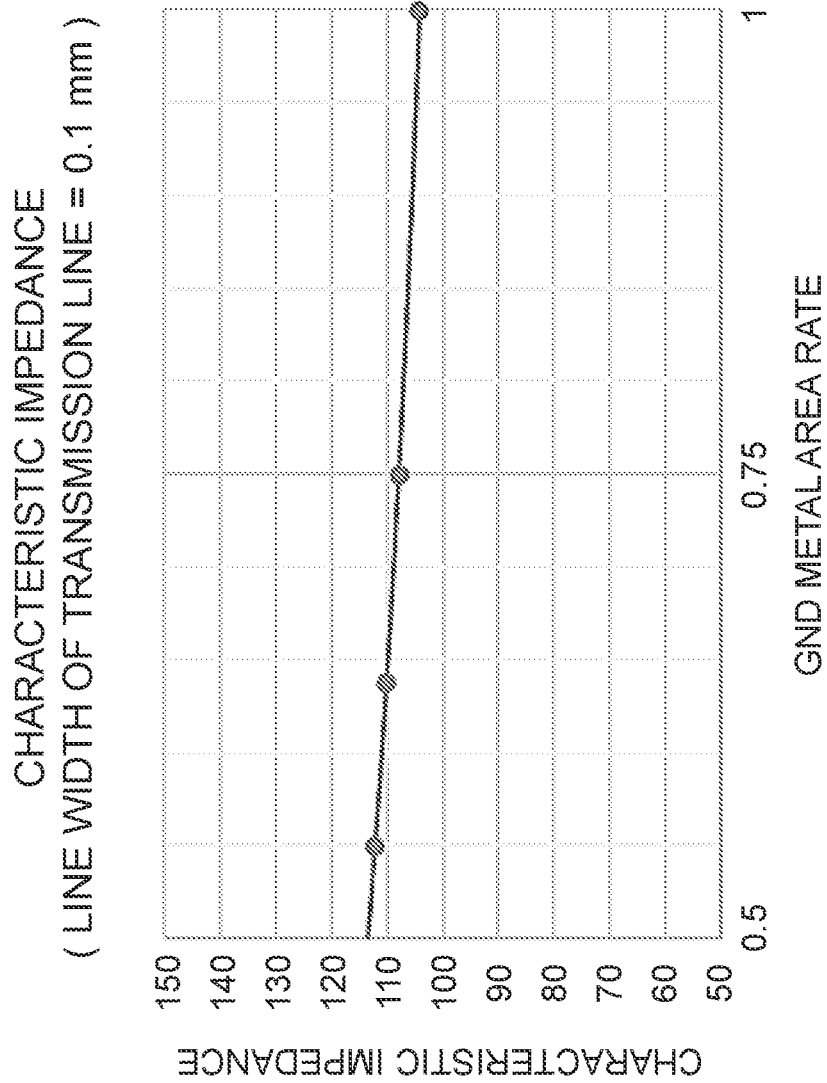
FIG. 3 is a graph showing the relationship between the GND metal ratio and the characteristic impedance.

FIG. 3, when fixing the wiring width of the signal transmission line SL, is a graph showing the relationship between the characteristic impedance and the area ratio of the conductive pattern remaining per unit area of the ground plane GP. The area ratio is hereinafter referred to as GND metal ratio. FIG. 3 is, for example, a graph when the wiring width of the signal transmission line SL is 0.1 mm. For example, if the characteristic impedance is adjusted to 110Ω when the wiring width of the signal transmission line SL is designed to be 0.1 mm, the GND metal ratio may be set to 0.64. As shown in FIG. 3, by changing the GND metal rate, the characteristic impedance of the signal transmission line is adjusted. That is, without changing the wiring width of the signal transmission line SL, it is possible to adjust the characteristic impedance by changing the GND metal ratio. Therefore, the GND metal ratio is determined so as to be the value of the desired characteristic impedance. The pattern width and pattern spacing of the mesh is determined to achieve the determined GND metal ratio.

Figure 4:
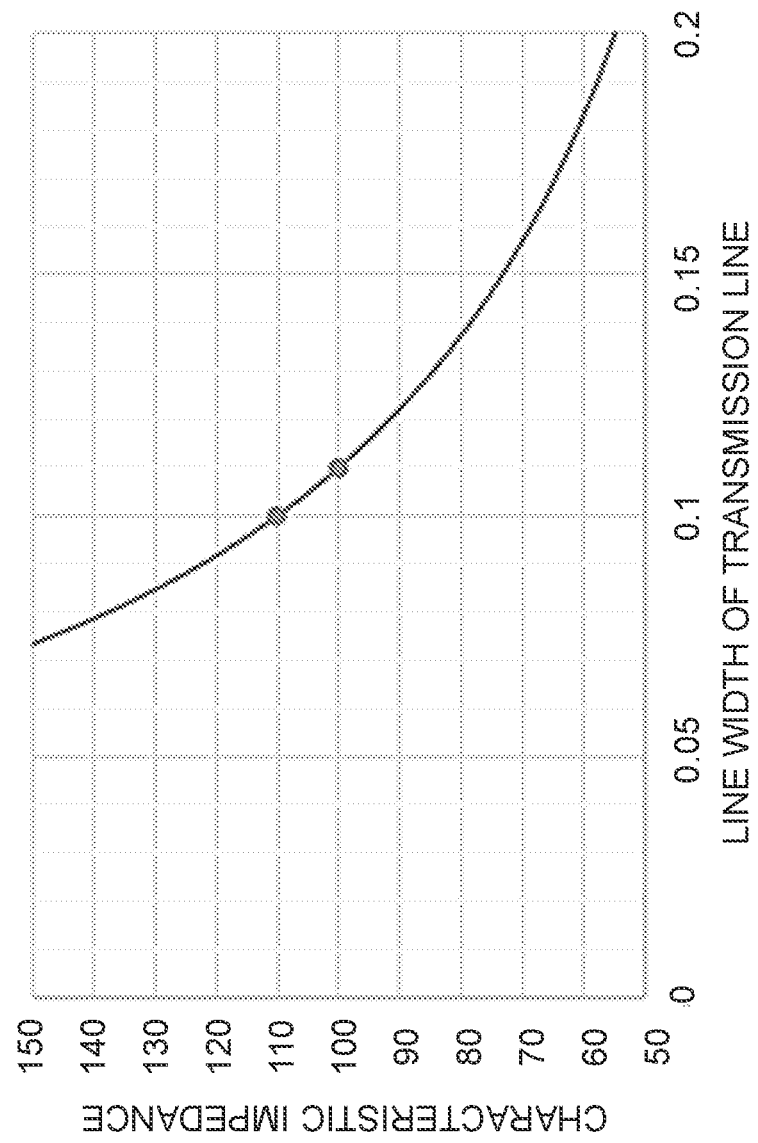
FIG. 4 is a graph showing the relationship between the wiring width and characteristic impedance of the signal transmission line.

FIG. 4 is a graph showing the relationship between the wiring width and the characteristic impedance of the signal transmission line when the GND metal ratio is fixed. As shown in FIG. 4, the characteristic impedance varies according to the wiring width of the signal transmission line. Therefore, the characteristic impedance is adjustable in the wiring width of the signal transmission line SL and the GND metal rate as shown in FIGS. 3 and 4. The thinning of the signal transmission line becomes susceptible to the effect of the roughness of the glass fiber of the prepreg and the manufacturing error of the wiring pattern, and the error of the characteristic impedance is apt to occur. However, according to the present embodiment, by changing the GND metal ratio, the signal transmission line while ensuring a predetermined wiring width, it is possible to adjust the characteristic impedance.

Incidentally, what is important in the design of the differential signal transmission line pair, as described above, is balance. In the present embodiment, as shown in FIG. 1, the differential signal transmission lines SLp, SLn are arranged such that the area of the conductive portion of the ground plane GP (first conductive portion) in the region where the differential signal transmission line SLp and the ground plane GP are overlapped in plan view becomes equal to the area of the conductive portion of the ground plane GP (second conductive portion) in the region where the differential signal transmission line SLn and the ground plane GP are overlapped in plan view. That is, the differential signal transmission lines SLp, SLn are arranged such that the GND metal ratios of the differential signal transmission lines SLp, SLn are the same. Furthermore, the differential signal transmission lines SLp, SLn are arranged such that the shape of the conductive portion of the ground plane GP in the region overlapping with the differential signal transmission line SLp in plan view and the shape of the conductive portion of the ground plane GP of the region overlapping with the differential signal transmission line SLn in plan view becomes symmetrical or the same. For example, when the openings have square shape, i.e., the ground plane GP has mesh shape, the differential signal transmission line pair is arranged in a linear shape so as to intersect at 45 degrees with respect to the two linear patterns extending in two directions to form a mesh shape. By such an arrangement of differential signal transmission lines SLp, SLn, it is possible to adjust the characteristic impedance while maintaining the balance of the differential signal transmission line pair.

First Modified Example of First Embodiment

Next, a first modified example of the first embodiment will be described. FIG. 5 is an explanatory diagram showing a configuration example of the semiconductor device 100a according to the present modified example. The difference from the first embodiment is that the ground plane GP is replaced with the ground plane GPa.

The ground plane GPa of the first modified example, as shown in FIG. 5, has openings OPa. Unlike the openings (OP) of the first embodiment, the openings OPa each have a circular shape. The openings OPa are regularly arranged in the ground plane GP. For example, the centers of the openings OPa are arranged to be at the face-centered position of the parallelogram. It is possible to change the GND metal ratio by changing the size of the openings OPa (e.g., diameter of the opening OPa) and the arrangement interval. Therefore, substantially the same effect as those of the first embodiment can be obtained in that the characteristic impedance can be adjusted.

Also in the present modified example, as described in the first embodiment, the differential signal transmission lines SLp, SLn are required to be arranged so as to maintain its balance. That is, the differential signal transmission line SLp, SLn are arranged such that the GND metal ratio for each become equal. In the present modified example, the openings OPa have each a circular shape. Therefore, it is possible to have a degree of freedom in the angle of the extending direction of the differential signal transmission lines SLp, SLn with respect to the conductive portion of the ground pattern GPa. That is, it is possible to improve the degree of freedom in wiring design of the differential signal transmission line pair. This is particularly useful when using a wiring pattern such as having a plurality of bent portions to arrange the differential signal transmission line pairs in equal length.

Further, the ground pattern GPa having circular openings OPa contributes to stabilize of the electrical characteristics. As described above, the ground plane GPa includes a return current path of the signal transmitting through the differential signal transmission line. The return current flows through the conductive portion of the ground plane GPa. If the path through which the return current flows is bent at a right angle or an acute angle, reflection may occur at the bent portion and noise may be generated. However, according to the present modified example, the return current flows along the arc of the circular openings OPa. Therefore, the return current flows uniformly without current concentration or reflection, as a result, it is possible to stabilize the electrical characteristics and suppress the signal quality deterioration.

Further, when adjusting the characteristic impedance by the GND metal ratio of the ground plane GP, the characteristic impedance of the differential signal transmission line SL is affected by the manufacturing error of the ground plane GP not a little. For example, in the case where there is a portion bent at a right angle in the pattern of the ground plane GP, there is a possibility that a liquid pool of the liquid developer is formed in the corner portion in the forming process, and a desired shape may not be formed. Therefore, when the differential signal transmission line is arranged on the corner portion, the GND metal ratio may become different from an assumed value. As a result, there is a possibility that the electrical characteristics will change. However, since the openings (OPa) of the ground pattern GPa in the present modified example has each a circular shape, the corner portion does not exist. Therefore, it is possible to form uniform circular openings. Therefore, since the manufacturing tolerance can also be uniform, there is no characteristic change in a specific portion of the differential signal transmission line, it is possible to prevent signal quality degradation of the differential signal.

Further, since the characteristic impedance can be adjusted by providing circular openings OPa in the ground pattern GPa, it is also possible to divert the general build-up substrate. That is, it is possible to reduce the cost.

Second Modified Example of First Embodiment

Figure 6A:
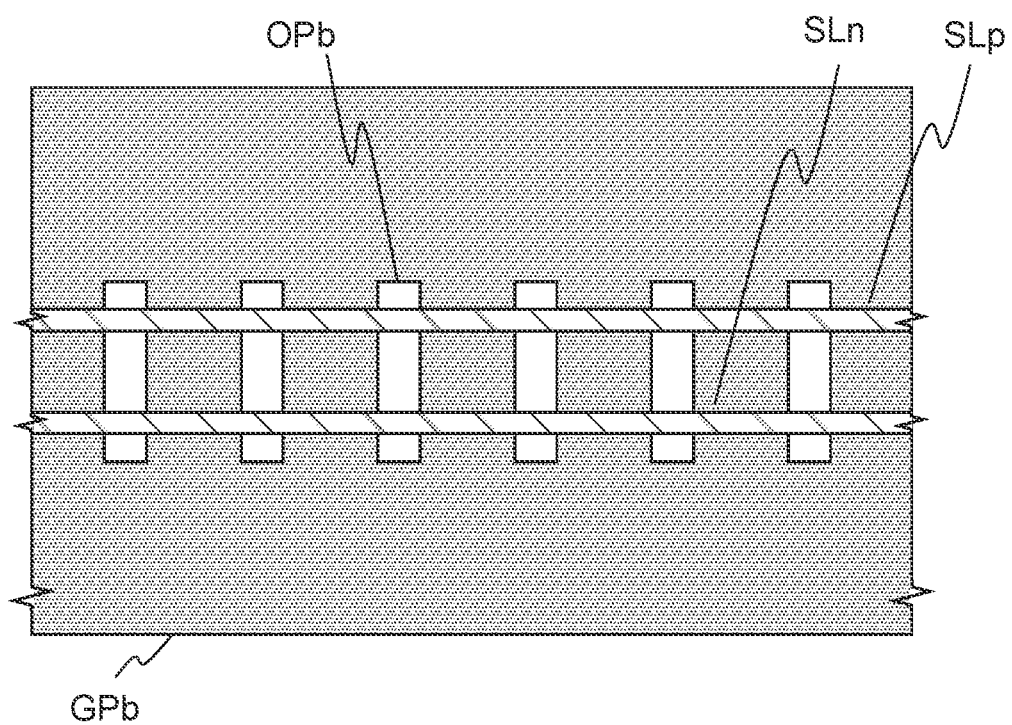
FIGS. 6A and 6B are explanatory diagrams showing a configuration example in a second modified example of the first embodiment.
Figure 6B:
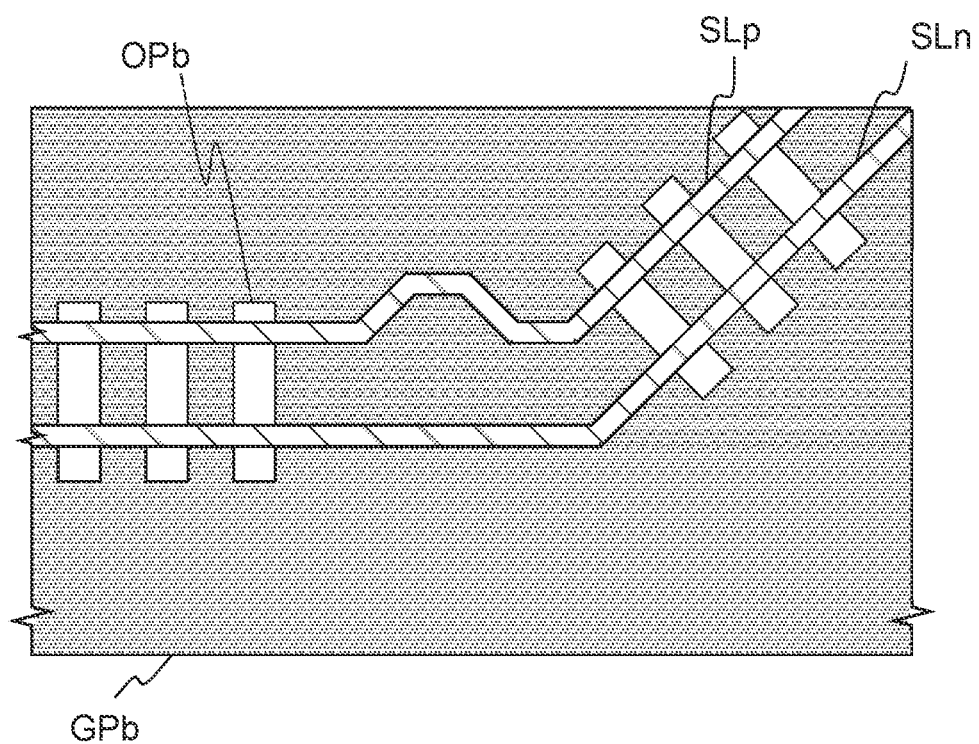

A second modified example of the first embodiment will be described with reference to FIGS. 6A, 6B. In the first embodiment, the ground plane GP has a mesh shape. In contrast, the ground plane GPb in the second modified example has rectangular openings OPb as shown in FIGS. 6A, 6B. Longitudinal direction of the opening OPb is a direction perpendicular to the extending direction of the differential signal transmission lines SLp, SLn such that the openings OPb are arranged across the differential signal transmission lines SLp, SPn. That is, the ground plane GPb has slit-shaped openings. The GND metal ratio is changed by adjusting the width or arrangement interval of the openings OPb.

Thus, the rectangular openings OPb are arranged across the differential signal transmission lines SLp, SLn, so that it is easy to maintain the balance of the differential signal transmission lines SLp, SLn. Further, as shown in FIG. 6B, when the differential signal transmission lines SLp, SLn have each a bent portion, it is possible to arrange the openings OPb avoiding the bent portion.

Second Embodiment

Figure 7:
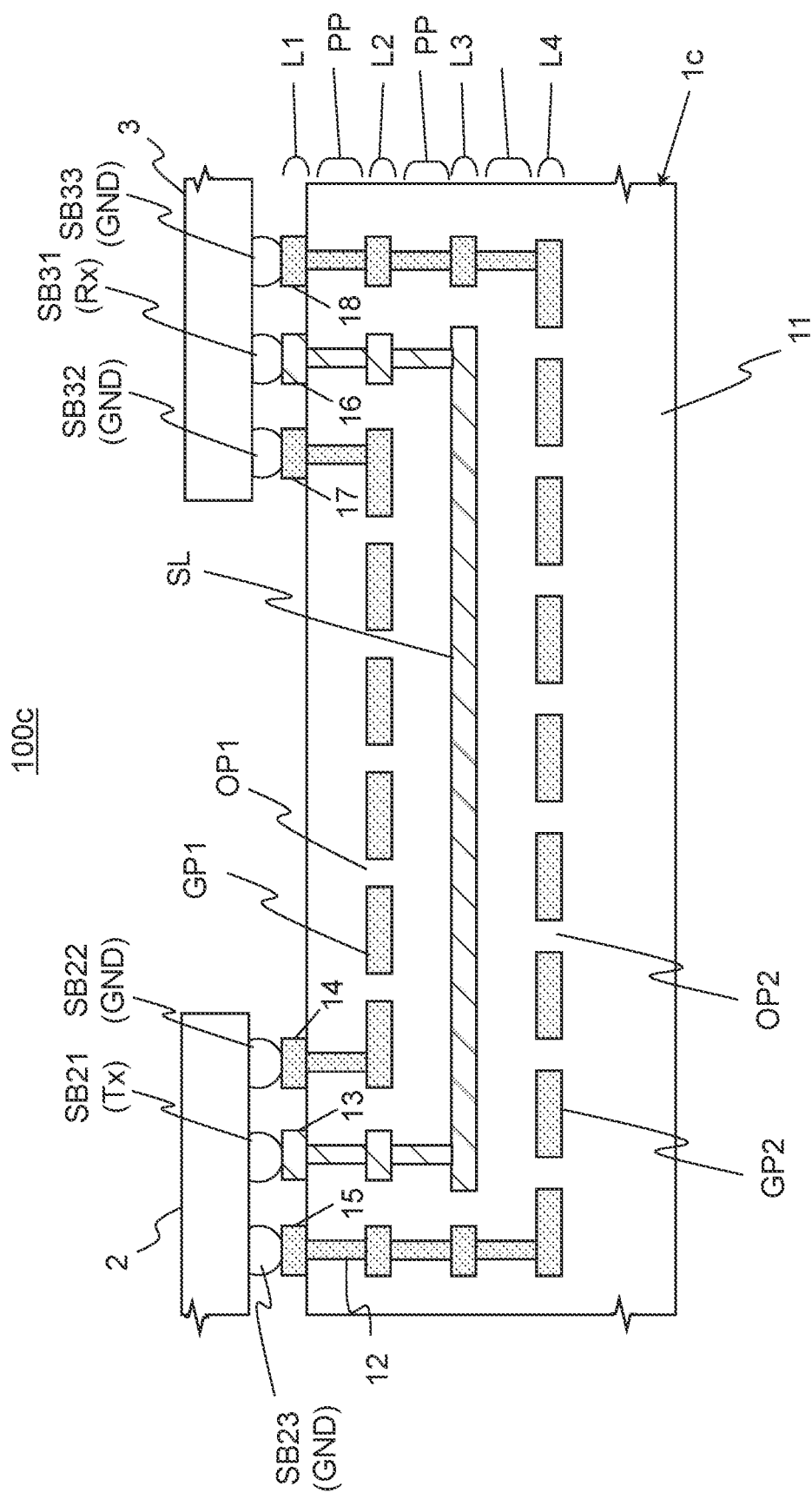
FIG. 7 is an explanatory diagram showing a configuration example of a semiconductor device of second embodiment.

Next, second embodiment will be described. FIG. 7 is an explanatory diagram showing a configuration example of the semiconductor device 100c according to the second embodiment. The difference between the first embodiment and the second embodiment is that the signal transmission line SL has a strip line structure. That is, the signal transmission line SL is formed in the conductive layer L3 of the wiring board 1. A ground planes GP1 and GP2 are formed in the conductive layers L2 and L4, respectively. The conductive layers L2 is formed above the conductive layer L3 and the conductive layer L4 is formed under the conductive layer L3.

The semiconductor device 100c according to the second embodiment will be described with reference to FIG. 7. The semiconductor device 100c includes a wiring board 1c and semiconductor packages 2 and 3 mounted on the wiring board 1c. The wiring board 1c, similarly to the wiring board 1 in the first embodiment, is a multilayer wiring board obtained by conductive layers and insulating layers having prepreg. As shown in FIG. 7, the wiring board 1c has conductive layers L1-L4 and a plurality of prepreg layers PP. Each prepreg layer PP is formed between the conductive layers and functions as an adhesive between the conductive layers. Incidentally, the wiring board 1c may further have a plurality of conductive layers and prepreg layers.

The terminal electrodes 13-18 are formed in the conductive layer L1 which is a surface layer of the wiring board 1c. The signal transmission line SL which is a differential signal transmission line is formed in the conductive layer L3. The signal transmission line SL is electrically connected to the transmission terminal Tx formed on the lower surface of the semiconductor package 2 through via 12, the terminal electrode 13 and the solder ball SB21. The signal transmission line SL is electrically connected to the receiving terminal Rx formed on the lower surface of the semiconductor package 3 through via 12, the terminal electrode 16 and the solder ball SB31.

The conductive layers L2, L4 which is upper and lower layer of the conductive layer L3 have the ground planes GP1, GP2. The return path of the signal transmitting through the signal transmission line SL is formed on the ground planes GP1, GP2. The ground plane GP1 is electrically connected to the GND terminal of the semiconductor package 2 through via 12, the terminal electrode 14 and the solder ball SB22. Similarly, the ground plane GP1 is electrically connected to the GND terminal of the semiconductor package 3 through via 12, the terminal electrode 17 and the solder ball SB32. The ground plane GP2 is electrically connected to the GND terminal of the semiconductor package 2 through via 12, the terminal electrode 15 and the solder ball SB23. Similarly, the ground plane GP2 is electrically connected to the GND terminal of the semiconductor package 3 through via 12, the terminal electrode 18 and the solder ball SB33. The ground planes GP1, GP2 in FIG. 7 are connected to the GND terminals of the semiconductor packages 2 and 3, but is not limited thereto.

The ground plane GP1 has a mesh shape as the first embodiment. The ground plane GP2 also has a mesh shape. Therefore, it possible to adjust the characteristic impedance in the similar way to the first embodiment.

In the present embodiment, since the signal transmission line SL is wired through the via 12, discontinuity in the characteristic impedance occurs between the conductive pattern of the signal transmission line SL and the via. The discontinuity in characteristic impedance may greatly reduce the signal quality. According to the present embodiment, the GND metal ratio is changed in accordance with approach to the connection points Vp, Vn. Herein, the connection point Vp is a point between the signal transmission line SL and the via 12 which is provided for electrically connecting the transmission terminal Tx. The connection point Vn is a point between the signal transmission line SL and the via 12 which is provided for electrically connecting the receiving terminal Rx. Thus, the discontinuity in the characteristic impedance is alleviated.

Figure 8:
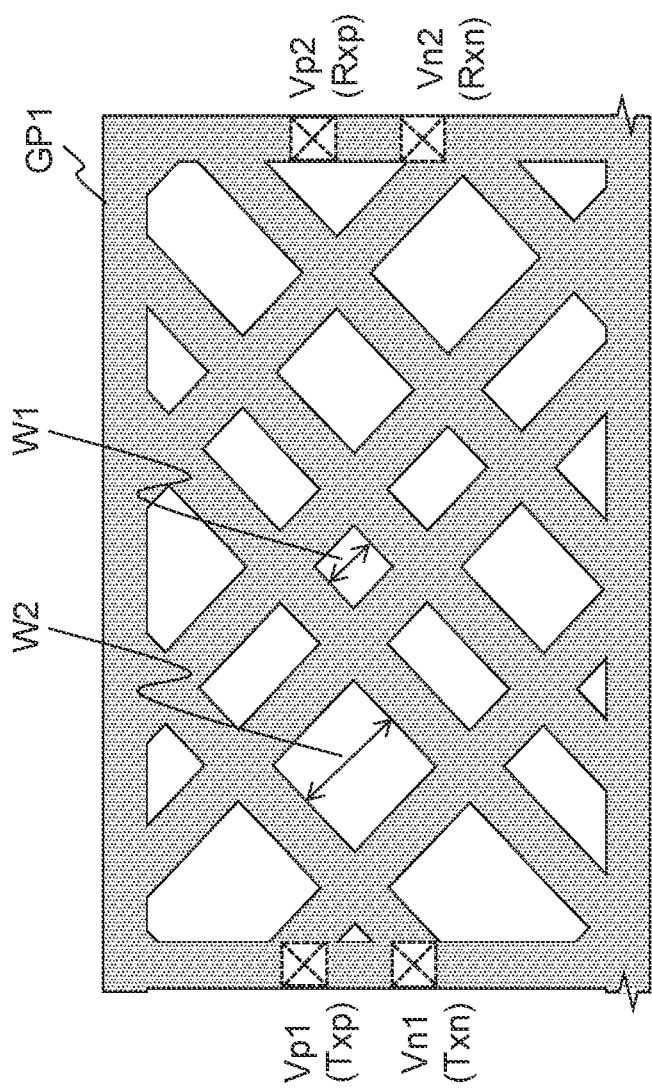
FIG. 8 is a plan view showing an example of the ground plane of the second embodiment.

FIG. 8 is a plan view showing a configuration example of ground plane GP1 or GP2 of the second embodiment. Since the ground plane GP2 has the same shape as the ground plane GP1, only the ground plane GP1 will be described below, and the illustration and explanation of the ground plane GP2 will be omitted.

In FIG. 8, the connection point Vp1 indicates the position of the via provided for electrically connecting the signal transmission line SLp and the transmission terminal Txp. The connection point Vn1 indicates the position of the via provided for electrically connecting the signal transmission line SLn and the transmission terminal Txn. Similarly, the connection point Vp2 indicates the position of the via provided for electrically connecting the signal transmission line SLp and the receiving terminal Rxp. The connection point Vn2 indicates the position of the via provided for electrically connecting the signal transmission line SLn and the receiving terminal Rxn. If the impedance of the via (or through-hole) is larger than the characteristic impedance of the signal transmission line SL, as in FIG. 8, the arrangement interval W2 of the conductive pattern of ground plane in the vicinity of the connection points Vp1, Vn1, Vp2 and Vn2 (i.e., in the vicinity of both ends of the signal transmission line SL) is reduced as compared with the arrangement interval W1 of the conductive pattern of ground plane at a point farther from the connection points Vp1, Vn1, Vp2, and Vn2 (i.e., in the vicinity of the center of the signal transmission line SL) (W1>W2). Further, by increasing the pattern width of the conductive pattern in the vicinity of the connection points Vp1, Vn1, Vp2, and Vn2, it may be adjusted GND metal ratio.

Thus, by adjusting the GND metal rate of the ground planes GP1, GP2, it is possible to alleviate the discontinuity in the characteristic impedance between the signal transmission line SL and the via. As a result, it is possible to suppress the degradation of the signal quality.

First Modified Example of Second Embodiment

Figure 9A:
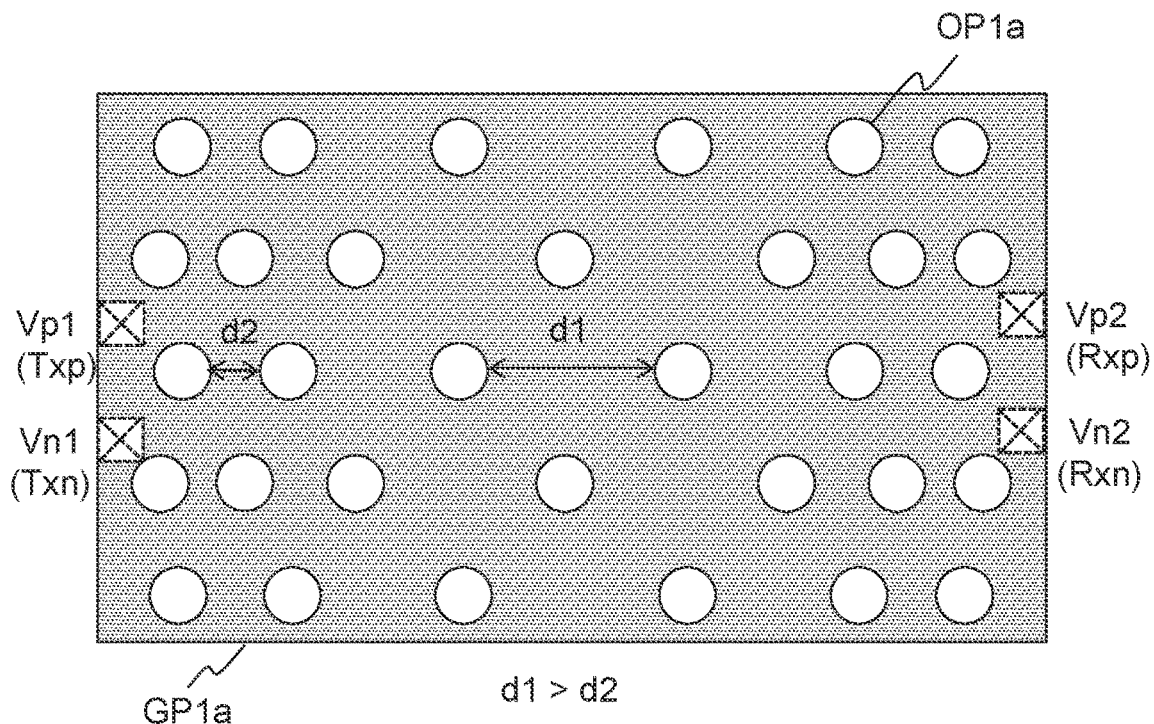
FIGS. 9A and 9B are a plan view showing an example of a ground plane in a first modified example of the second embodiment.
Figure 9B:
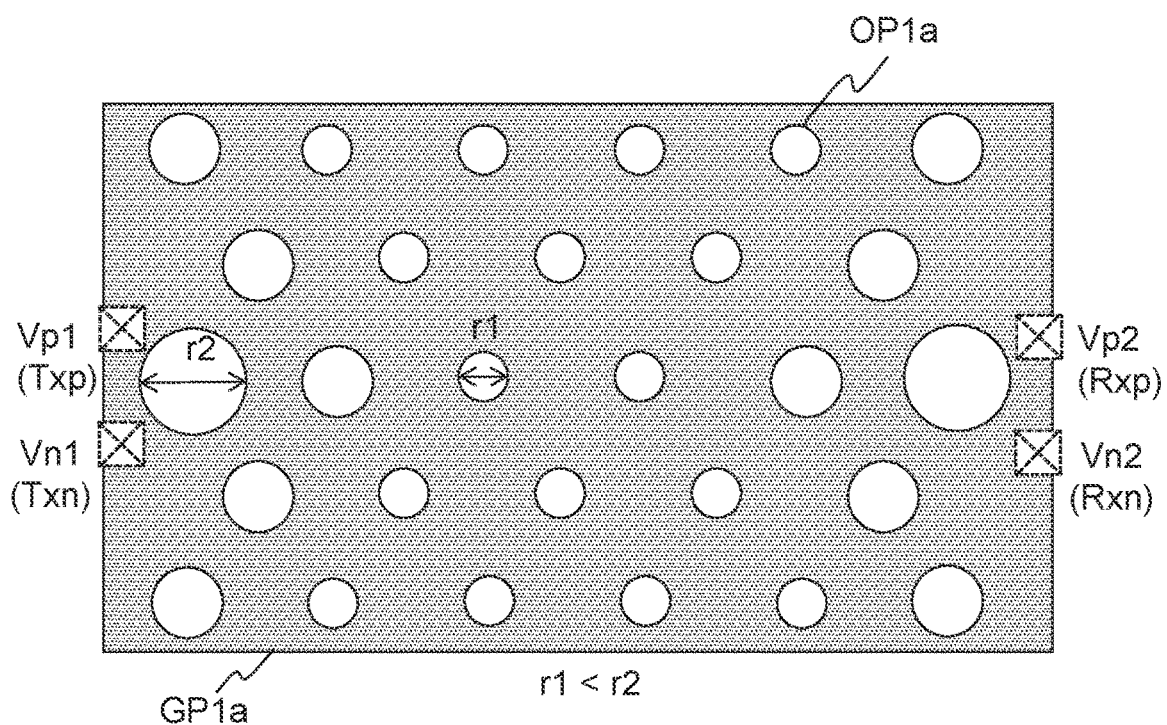

FIG. 9A, 9B are plan views showing an example of the configuration of a ground plane according to first modified example of the second embodiment. The ground planes GP1, GP2 of the second embodiment may be ground planes GP1a, GP2a having circular openings OP1a, OP2a. Since the ground planes GP1a, Gp2a may have the same configuration, only the ground plane GP1a is shown in FIGS. 9A, 9B, and illustration and explanation of the ground plane GP2a are omitted.

According to the first modified example, as shown in FIG. 9A, the arrangement density of the opening OP1a disposed in the vicinity of the connecting points Vp1, Vn1, Vp2, Vn2 is changed. Specifically, the arrangement density is increased by narrowing the arrangement interval of the openings OP1a as they approach the connecting points Vp1, Vn1, Vp2, Vn2. Further, as shown in FIG. 9B, the diameters of the openings OP1a disposed in the vicinity of the connection points Vp1, Vn1, Vp2, Vn2, is increased than the diameters of the openings OP1a disposed in the vicinity of the center of the signal transmission line SL. By providing such an opening OP1a, it is possible to change the GND metal ratio in the vicinity of the vias, as a result, it is possible to alleviate the discontinuity in the characteristic impedance in the vicinity of the vias.

Second Modified Example of Second Embodiment

Figure 10:
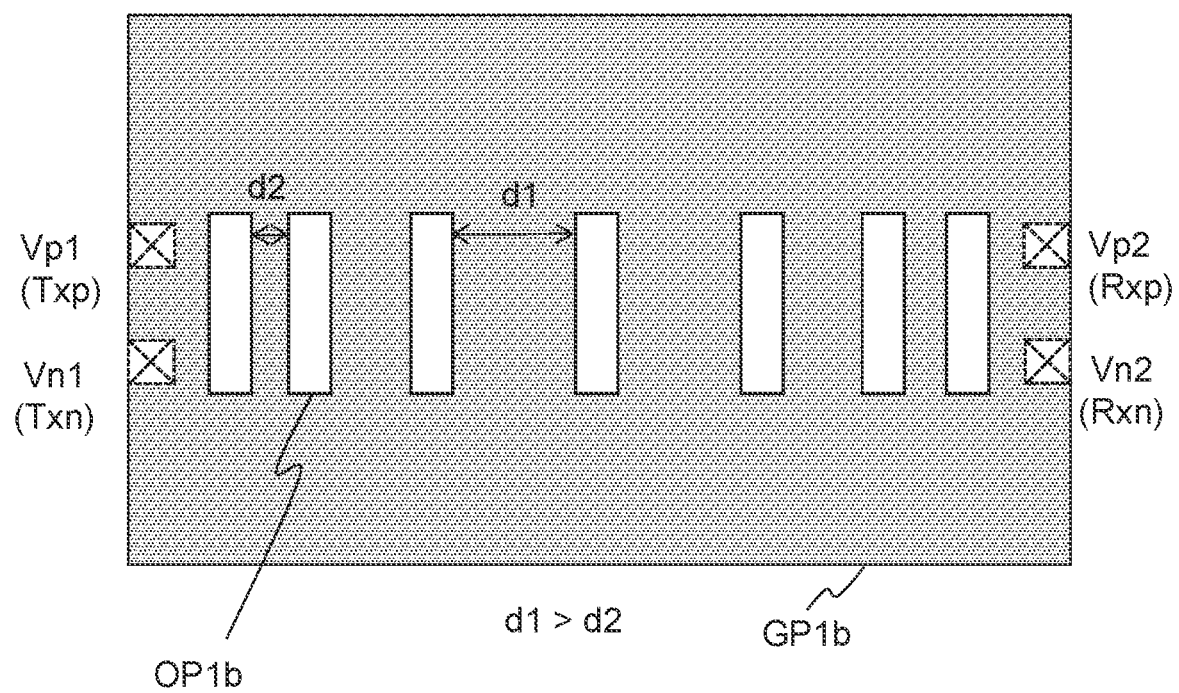
FIG. 10 is a plan view showing an example of the ground plane of a second modified example of the second embodiment.

Next, a second modified example of the second embodiment will be described with reference to FIG. 10. In the second modified example of the second embodiment, the ground planes GP1, GP2 of the second embodiment, may be ground planes GP1b, GP2b each having slit-shaped openings. FIG. 10 shows a ground plane GP1b in second modified example of the second embodiment. The ground plane GP2b has the same configuration as that of the ground plane GP1b, and therefore, illustration and explanation thereof are omitted.

The ground plane GP1b, similarly to the ground plane GPb of the second modified example of the first embodiment, has rectangular openings OP1b orthogonal to the extending direction of the differential signal transmission lines SLp, SLn in plan view. In second modified example of the second embodiment, the arrangement intervals of the openings OP1b in the vicinity of the connection points Vp1, Vn1, Vp2, Vn2 of the vias are reduced than the arrangement interval of the openings OP1b disposed in the center portion of the differential signal transmission line SL. Thus, almost the same effect as the second embodiment, i.e., it is possible to alleviate the discontinuity in the characteristic impedance in the vicinity of the vias.

Although the invention made by the present inventor has been specifically described based on the embodiment, the present invention is not limited to the embodiment described above, and it is needless to say that various modifications can be made without departing from the gist thereof.

For example, the openings OP may have a polygonal shape of a square or more. Further, the semiconductor package 3 may be a connector for connecting to an external device. Further, in this embodiment, the differential signal transmission line SL and the ground plane GP has been described as being provided on the printed wiring board, it is also possible to apply to the signal transmission line and the ground plane of the semiconductor package substrate which is a wiring board in the semiconductor package.

What is claimed is:
1. A semiconductor device comprising:
   a semiconductor package having a differential signal terminal pair; and
   a wiring board on which the semiconductor package is mounted,
   wherein the wiring board comprises:
      a first and a second signal transmission line formed in a first conductive layer and electrically connected to the differential signal terminal pair; and
      a first reference potential plane having a first conductive pattern which is formed in a second conductive layer adjacent to the first conductive layer and which includes a first region overlapped with the first signal transmission line in plan view and a second region overlapped with the second signal transmission line in plan view,
   wherein the first conductive pattern has a plurality of first openings in the first and the second region,
   wherein the first and the second signal transmission line is arranged such that an area of a first conductive potion of the reference potential plane in the first region becomes equal to an area of a second conductive potion of the reference potential plane in the second region,
   wherein the semiconductor device further comprises:
      a second reference potential plane having a second conductive pattern which is formed in a third conductive layer adjacent to the second conductive layer across the first conductive layer and which includes a third region overlapped with the first signal transmission line in plan view and a fourth region overlapped with the second signal transmission line in plan view, and
   wherein the second conductive pattern includes a plurality of second openings.
2. The semiconductor device according to claim 1, wherein the reference potential plane is supplied with a ground potential.
3. The semiconductor device according to claim 1, wherein the plurality of the first openings each have a circular shape and are arranged to be at the face-centered position of parallelogram.
4. The semiconductor device according to claim 1, wherein the plurality of first openings each have a slit shape and are provided to cross the first and the second signal transmission line.
5. A semiconductor device comprising: according to claim 1,
   a semiconductor package having a differential signal terminal pair; and
   a wiring board on which the semiconductor package is mounted, wherein the wiring board comprises:
- a first and a second signal transmission line formed in a first conductive layer and electrically connected to the differential signal terminal pair; and
- a reference potential plane having a conductive pattern which is formed in a second conductive layer adjacent to the first conductive layer and which includes a first region overlapped with the first signal transmission line in plan view and a second region overlapped with the second signal transmission line in plan view, wherein the conductive pattern has a plurality of openings in the first and the second region, wherein the first and the second signal transmission line is arranged such that an area of a first conductive potion of the reference potential plane in the first region becomes equal to an area of a second conductive potion of the reference potential plane in the second region, wherein the first signal transmission line is connected to one of the differential signal terminal pair through a first via formed in the wiring board, wherein the second signal transmission line is connected to the other of the differential signal terminal pair through a second via formed in the wiring board, wherein a first conductive portion area ratio of the first reference potential plane per unit area in the vicinity of the center of the first region is different from a second conductive portion area ratio of the first reference potential plane per unit area in the end of the first region, and wherein a third conductive portion area ratio of the first reference potential plane per unit area in the vicinity of the center of the second region is different from a fourth conductive portion area ratio of the first reference potential plane per unit area in the end of the second region.

6. The semiconductor device according to claim 5, wherein the second signal transmission line is connected to the other of the differential signal terminal pair through a second via formed in the wiring board, wherein size of the openings arranged in the vicinity of the center of the first region or the second region is different from size of the openings arranged in the vicinity of the end of the first region or the second region.

7. The semiconductor device according claim 5, wherein an arrangement density of the openings arranged in the vicinity of the center of the first region or the second region is different from an arrangement density of the openings arranged in the vicinity of the end of the first region or the second region.

* * * * *